: 
United States Patent
Lechner et al.

(10) Patent No.: US 7,586,136 B2
(45) Date of Patent: Sep. 8, 2009

(54) SEMICONDUCTOR STRUCTURE

(75) Inventors: Peter Lechner, Holzkirchen (DE); Gerhard Lutz, Munich (DE); Rainer Richter, Munich (DE); Lothar Struder, Munich (DE)

(73) Assignee: Max-Planck-Gesellschaft zur Forderung der Wissenschaften E.V., Munich (DE)

( * ) Notice: Subject to any disclaimer, the term of this patent is extended or adjusted under 35 U.S.C. 154(b) by 498 days.

(21) Appl. No.: 10/597,504

(22) PCT Filed: Jan. 17, 2005

(86) PCT No.: PCT/EP2005/000402

§ 371 (c)(1),
(2), (4) Date: Oct. 4, 2006

(87) PCT Pub. No.: WO2005/074012

PCT Pub. Date: Aug. 11, 2005

(65) Prior Publication Data

US 2008/0230811 A1    Sep. 25, 2008

(30) Foreign Application Priority Data

Jan. 28, 2004    (DE)    ........................ 10 2004 004 283

(51) Int. Cl.
*H01L 27/00* (2006.01)
(52) U.S. Cl. .............................. 257/258; 257/E27.148
(58) Field of Classification Search ................. 257/257, 257/258, 448, E27.148, E31.079, E31.126
See application file for complete search history.

(56) References Cited

U.S. PATENT DOCUMENTS 5,786,609 A    7/1998    Kemmer et al.

FOREIGN PATENT DOCUMENTS

DE    43 31 391 A1    3/1995

OTHER PUBLICATIONS

Neeser, et al: "DEPFET-a pixel device with integrated amplification." Nuclear Instruments and Methods in Physics Research A 477 (2002) 129-136.
Fischer, et al: "First operation of a pixel imaging matrix based on DEPFET pixels." Nuclear Instruments and Methods in Physics Research A 451 (2000) 651-656.
Ulrici, et al: "Spectroscopic and imaging performance of DEPFET pixel sensors." Nuclear Instruments and Methods in Physics Research A 465 (2001) 247-252.

*Primary Examiner*—Thomas L Dickey
(74) *Attorney, Agent, or Firm*—Caesar, Rivise, Bernstein, Cohen & Pokotilow, Ltd.

(57) ABSTRACT

The invention relates to a semiconductor structure, especially for use in a semiconductor detector. The semiconductor structure includes a weakly doped semiconductor substrate (HK) of a first or second doping type, a highly doped drain region (D) of a second doping type, located on a first surface of the semiconductor substrate (HK), a highly doped source region (S) of the second doping type, located on the first surface of the semiconductor substrate (HK), a duct (K) extending between the source region (S) and the drain region (D), a doped inner gate region (IG) of the first doping type, which is at least partially located below the duct (K), and a blow-out contact (CL) for removing charge carriers from the inner gate region (IG). According to the invention, the inner gate region (IG) extends in the semiconductor substrate (HK) at least partially up to the blow-out contact (CL) and the blow-out contact (CL) is located on the drain end relative to the source region (S).

34 Claims, 9 Drawing Sheets

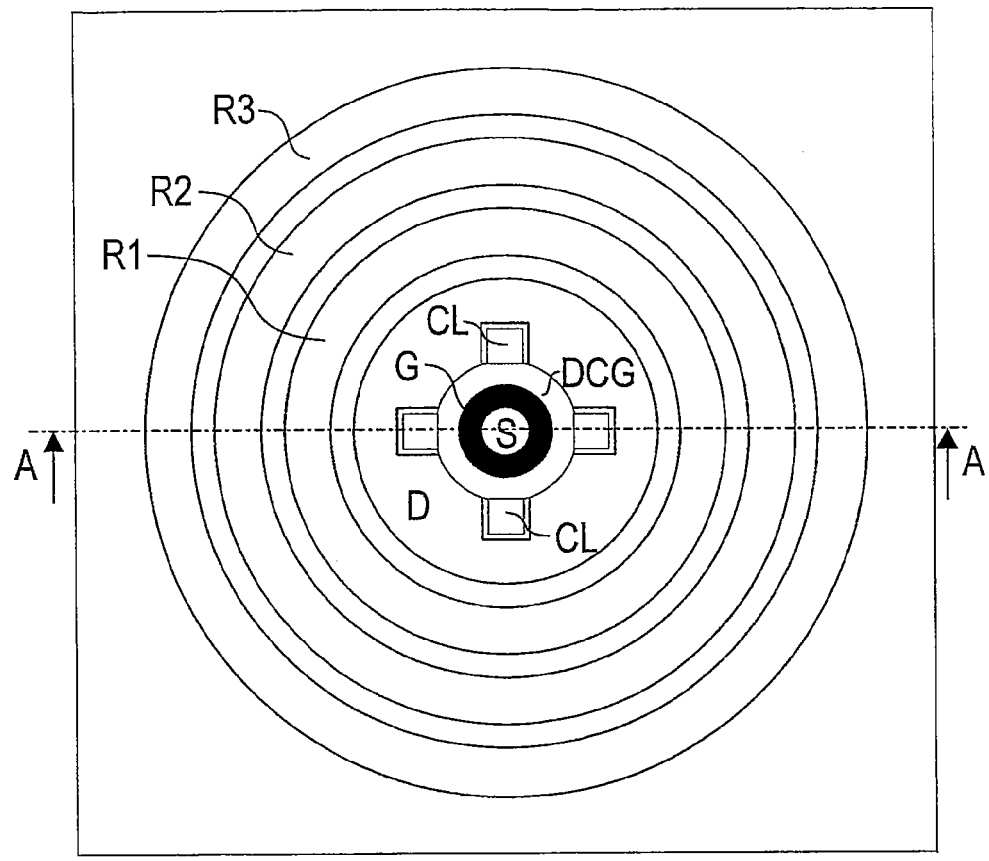
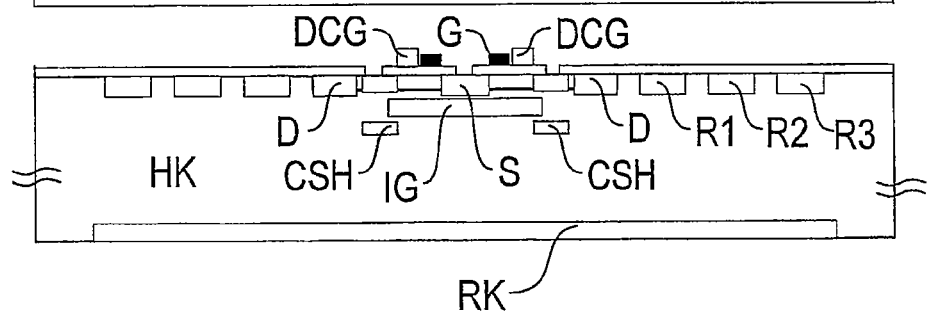
FIG 7a
FIG 7b

SEMICONDUCTOR STRUCTURE

BACKGROUND OF THE INVENTION

The invention relates to a semiconductor structure, particularly for use in a semiconductor detector according to the invention.

The use of so-called drift detectors for radiation detection is known which detectors are described, for example, in L. STRÜDER: "Nuclear Instruments and Methods in Physics Research A", Vol. 454, 2000, DE 34 27 476 A1 as well as in DE 102 13 812 A1. In this case, the radiation to be detected produces signal electrons in a weakly doped and depleted semiconductor substrate, several ring-shaped and concentrically arranged electrodes being located at one surface of the semiconductor substrate, which electrodes produce in a semiconductor substrate a drift field, through which the signal electrons produced by the radiation drift to a centrally arranged read-out element that detects the signal electrons and, subsequently, the taken-up radiation.

The read-out element can consist here of a DEPFET transistor (DEPFET—Depleted Field Effect Transistor) which was invented in 1984 by J. Kemmer and G. Lutz. Such a DEPFET transistor can have a weakly n-doped, depleted semiconductor substrate, a highly p-doped rear electrode being arranged on one surface of the semiconductor substrate, which rear electrode forms a diode poled in the blockage direction with the weakly n-doped semiconductor substrate and serves the purpose of depletion of the semiconductor substrate, wherein holes originating in the semiconductor substrate as a result of radiation effect are suctioned off by way of the rear electrode from the semiconductor substrate.

On the opposing surface of the semiconductor substrate where a DEPFET transistor is concerned, there is a highly p-doped source region and also a highly p-doped drain region, a channel being located between the source region and the drain region, and the conductivity of this channel can be set by a gate electrode that can be externally activated.

In the semiconductor substrate a weakly n-doped inner gate region is located below the channel, in which there is a gathering of signal electrons originating in the semiconductor substrate as a result of the radiation effect. The electric charge accumulated in the inner gate region controls the conductivity of the channel between the source region and the drain region in a similar manner to that of the external gate electrode, so that the drain-source-current is a measure for the detected radiation.

However, the signal electrons gathered in the inner gate region must be removed occasionally from the inner gate region in order to maintain the sensitivity of the drift detector. For this purpose, a separate clear contact is envisaged with the known DEPFET transistors that is located on the source side next to the DEPFET transistor itself and which suctions off the signal electrons gathered in the inner gate region with the application of a positive electric voltage.

A disadvantage with this known structural configuration of a DEPFET transistor is the fact that high electric voltages are required for clearing, whereby a complete removal of the signal electrons gathered in the inner gate region is often not even possible at all.

The invention is therefore based on the task of creating a semiconductor structure according to a DEPFET transistor where a complete and thorough clearing to the greatest possible extent is enabled with lesser levels of electric voltages.

SUMMARY OF THE INVENTION

The invention is based on the knowledge that the source region of the DEPFET structure produces in the semiconductor substrate a potential barrier which makes difficult the suctioning of the signal electrons gathered in the inner gate region caused by the clear contact so that, with the known DEPFET transistors, a high clear voltage is required so that the signal electrons can overcome the potential barrier.

For this reason, the invention comprises the technical directive that the inner gate region of the semiconductor structure in the semiconductor substrate extends at least partially up to the clear contact in order to facilitate the suctioning of the charge carriers from the inner gate region.

Moreover, the invention comprises the technical directive of no longer locating the clear contact on the source side next to the DEPFET structure but rather on the drain side so that the signal electrons gathered in the inner gate region, and during suctioning through the clear contact, no longer have to overcome the potential barrier produced by the source region.

In one variant of the invention the clear contact in the semiconductor substrate is located at least partially between the source region and the drain region, and this is particularly advantageous with a ring-shaped and closed DEPFET structure.

However, it is also alternatively possible that the clear contact is located on a side of the gate region facing away from the source region, and this can be particularly advantageous with a linear DEPFET structure.

In addition, the semiconductor structure according to the invention preferably comprises a so-called drain/clear region that can be selectively activated as an auxiliary clear contact or as a drain, the drain/clear region bordering preferably at the clear contact and the drain region. During the clear process, the drain/clear region activated as auxiliary clear contact produces no potential barrier brought about by drain implantation or limitation of the buried doping of the inner gate region, which barrier does not have to be overcome during clearing by the charge carriers gathered in the inner gate region, so that relatively low level electric voltages at the clear contact are sufficient for clearing. In case the semiconductor substrate is weakly n-doped and the source region and the drain region are highly p-doped, then the drain/clear region acts as a drain with a sufficient negative electric voltage at the drain/clear region whereas the drain/clear region with a sufficient positive voltage enables a clearing of the charge carriers stored in the inner gate region by the clear contact.

By exchanging the source region and the drain region a source/clear region can be correspondingly envisaged instead of the drain/clear region, and this source/clear region can be selectively activated as an auxiliary clear contact or as a source, the source/clear region preferably bordering at the clear contact and at the source region. However, the function of the source/clear region is essentially the same as the function of the drain/clear/region as described herein. In this context it is to be mentioned that the semiconductor structure according to the invention can also be doped in the reverse. For this reason and within the framework of this description, general reference is made here to a first doping type and to a second doping type. With the first doping type for the semiconductor substrate, the inner gate region and the clear contact, an n-doping is preferably involved whereas the second doping type for the rear electrode, the source region, the drain region, the shield region below the clear contact as well as the preferably large-surface shield region below the source region is preferably a p-doping.

However, in reverse manner it is also possible that the first doping type for the semiconductor substrate, the inner gate region and the clear contact is a p-doping, whereas the second doping type for the source region, the drain region, the rear electrode and the shield regions is formed by means of a n-doping.

In one variant of the invention, a doped shield region of the second doping type is located in the semiconductor substrate below the inner gate region below the clear contact in order to electrically shield off the clear contact. For an n-doped inner gate region and a weak n-doped semiconductor substrate, this shield region is correspondingly p-doped. The shield region below the clear contact and the inner gate region prevents the signal electrons originating in the semiconductor substrate as a result of the radiation effect from flowing directly to the clear contact instead of gathering in the inner gate region.

In one variant of the invention the inner gate region in the semiconductor substrate extends from the source region to the drain region and goes even preferably all the way completely.

However, one aspect to be given consideration here is that the signal electrons in the inner gate should gather below the channel of the DEPFET transistor and not below its source region in order to be able to control the conductivity of the channel. For this reason, the doping of the source region is preferably set in such a way that this reaches partially vertical into the inner gate region where it compensates the doping of the inner gate region, which leads to a potential barrier for signal electrons gathered in the inner gate region. By means of this potential barrier, the signal electrons gathered in the inner gate region are displaced from the source region and concentrated below the channel of the DEPFET structure, through which the control effect of the gathered signal electrons is improved.

However, it is also alternatively possible that the inner gate region in the semiconductor substrate is spaced apart from the source region so that the signal electrons gathered in the inner gate region cannot make their way to below the source region, but are rather concentrated below the channel of the DEPFET structure and are dislocated in the direction of the drain where they effectively control the conductivity of the channel.

If the inner gate region in the semiconductor substrate does not extend to below the source region, it must be observed however that holes can be emitted from the source region into the semiconductor substrate and then flow to a rear electrode located on the opposite side of the semiconductor substrate. However, within the framework of the invention, this can be prevented by means of an additional shield region which is located in the semiconductor substrate below the inner gate region and can, for example, extend over the entire surface of the semiconductor substrate. This additional shield region is doped according to the first doping type. This means that the additional shield region is also n-doped for the purpose of shielding off the source region and for preventing a hole emission involving a weakly n-doped semiconductor substrate.

With one variant of the invention, the channel of the DEPFET structure immediately borders on the clear contact.

However, it is also alternatively possible that the channel is led only up to a pre-specified distance to the clear contact. Such a distance between the channel and the clear contact advantageously reduces the electric field strength at the periphery of the clear contact. For the same reason, the drain/clear region can also be drawn back slightly from the clear contact.

The term "channel" as used within the framework of the invention can be defined functionally or structurally, as described briefly below.

The channel, for example, with so-called enhancement transistors is not particularly doped and is therefore not different from the surrounding semiconductor substrate, so that the channel is originally established by the external activation with the so-called gate. In this case, the channel is the current-transporting region of the semiconductor substrate between drain and source.

With other transistor types, as in the case of a JFET for example, the channel by contrast is particularly doped and therefore allows itself to be spatially localized independent of the function of the power line.

It is to be mentioned further that the drain region with the DEPFET structure according to the invention can be divided up into several partial regions spaced apart from one another. A partial region of the drain region can then be directly contacted, for example, while the other partial region of the drain region can be contacted by way of an inversion layer below the drain/clear region.

In this case a line crossover can be applied for the contacting of the drain region or of its partial regions which is described, for example, in DE 102 13 812 A1, so that the content of this printed matter is to be ascribed in the full scope to the description presented here with regard to the structural configuration of a line crossover.

It was already briefly mentioned above that the DEPFET structure according to the invention can be formed in a ring-shaped manner and has, accordingly, a ring-shaped gate region.

With such a ring-shaped configuration of the DEPFET structure, the clear contact and/or the drain region and/or the drain/clear region can be located within the ring-shaped gate region while the source region is located outside of the ring-shaped gate region.

However, it is also alternatively possible that the clear contact and/or the drain region and/or the drain/clear region can be outside of the ring-shaped gate while the source region is located within the ring-shaped gate region Furthermore, the drain/clear region can adjoin to the entire periphery of the ring-shaped gate region. However, it is also alternatively possible that the ring-shaped gate region adjoins to the drain/clear region with only a part of the periphery and with the rest of the periphery to a doped region of the second doping type (normally p-doped) which is connected to the drain region and/or adjoins to the drain region.

Furthermore, the clear contact can be divided up into several parts spaced apart from one another, or several clear contacts can be envisaged which are separated from one another. This provides the advantage to the effect that the mean distance between the signal electrons to be suctioned off and the nearest-located clear contact is reduced, and this leads to a shortening of the clearing process with a pre-specified diffusion speed of the signal electrons. In the result, this enables a quicker clearing.

Furthermore, it is to be mentioned that the clear contact with the semiconductor structure according to the invention can have underneath a doped layer of the second doping type (normally p-doped).

Furthermore, it is to be mentioned that silicon is preferably used as a semiconductor material. However, the invention is not limited to silicon with regard to the semiconductor material adopted, but can also be realized with other semiconductor materials. Moreover, other insulator and conductor materials can also be used with the semiconductor structure according to the invention.

It is understood here as a matter of course that the above-mentioned drain/clear region is preferably a MOS-region.

In addition, it is clear to the person skilled in the art that the semiconductor structure according to the invention can belong to the depletion type, where an additional channel implantation is envisaged.

However, it is also alternatively possible that the semiconductor structure according to the invention belongs to the enrichment type, where no additional channel implantation must be effected.

Furthermore, the drain/clear region mentioned here or the source/clear region can be provided with a surface-near implantation of the second doping type underneath. This additional surface-near doping brings about a shifting of the voltages at the source/clear region and/or the drain/clear region as required for the operation of the structure. These can be subsequently brought into a more favorable region. This is particularly necessary for enrichment types because otherwise the positive charges occurring with silicon in the current-carrying condition require a high negative voltage at the SCG and/or the DCG. It is, of course, also possible to take an analogous action for the gate region.

Finally, the invention comprises not only the DEPFET structure as described above but also relates to a complete detector where the DEPFET structure according to the invention is deployed as a read-out element of the detector. In order to avoid repetitions, and with regard to the configuration of such a semiconductor detector, reference is made to the printed matter DE 102 13 812 A1 as already quoted above whose content is to be ascribed in the full scope to the description presented herein with regard to the configuration of a semiconductor detector.

BRIEF DESCRIPTION OF SEVERAL VIEWS OF THE DRAWINGS

Other advantageous further developments of the invention are designated in the dependent claims or are explained as follows in greater detail together with the description of the preferred embodiment examples of the invention on the basis of the Figures presented. The Figures show the following:

FIG. 7b: a cross-sectional view of the drift detector from FIG. 7a along the cross-sectional line A-A in FIG. 7a, FIG. 8a: a further embodiment example of a drift detector with a DEPFET structure, according to the invention, as read-out element in a top view illustration, a source/clear region having a surface-near doping underneath, FIG. 9b: a cross-sectional view of the drift detector from FIG. 9a along the cross-sectional line A-A in FIG. 9a.

DETAILED DESCRIPTION OF THE PREFERRED EMBODIMENTS

Figure 1A:
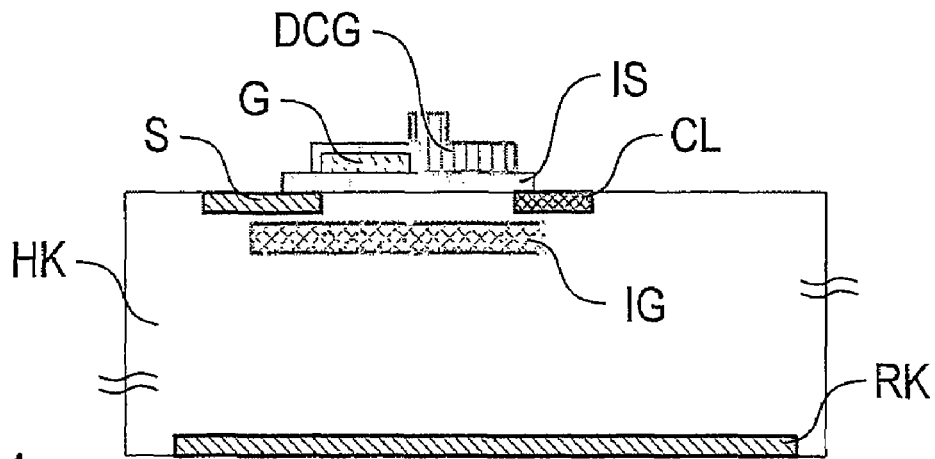
FIG. 1a: a cross-sectional view of a linear DEPFET structure, according to the invention, along the cross-sectional line A-A in FIG. 1b, FIG. 1b: a top view illustration of the DEPFET structure from FIG. 1a, FIG. 1c: a cross-sectional view of the DEPFET structure from FIGS. 1a and 1b along the cross-sectional line B-B in FIG. 1b, FIG. 2: a further embodiment example of a DEPFET structure, according to the invention, in a top view illustration.
Figure 1B:
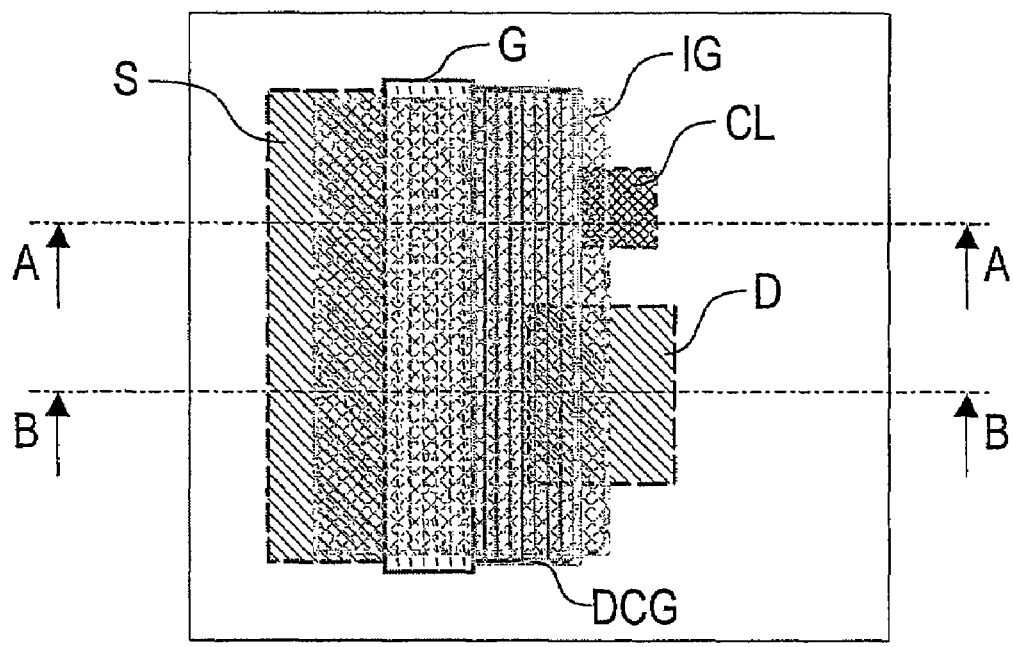
Figure 1C:
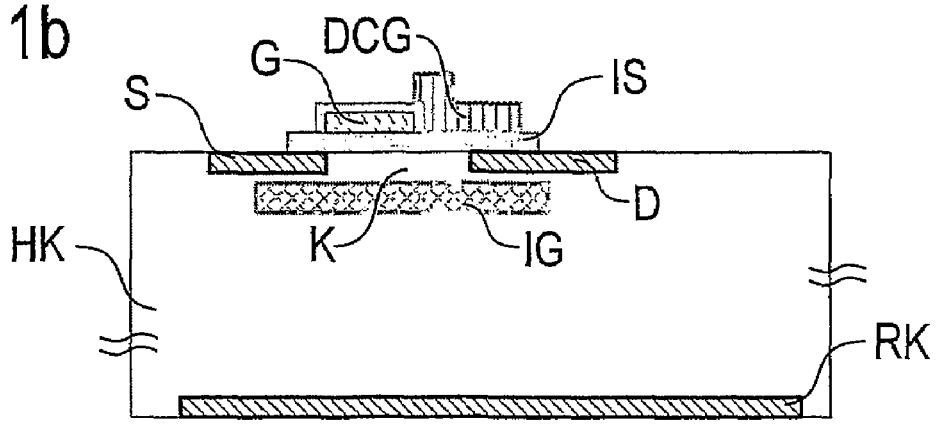

The DEPFET structure as shown in FIGS. 1a-1c can be deployed as a read-out element in a drift detector, as described in L. STRÜDER: "Nuclear Instruments and Methods in Physics Research A", Vol. 454, 2000 as well as in DE 34 27 476 A1, so that the content of these publications is to be ascribed in the full scope to the following description.

The DEPFET structure according to the invention has a weak n-doped plate-shaped semiconductor body HK which can have, for example, a thickness of 300 μm.

On the rear side of the semiconductor body HK, lying below in the drawing, a flat-type electrode RK is located, which consists of a highly p-doped region, the electrode RK together with the semiconductor body HK forming a diode poled in the blockage direction and serving the purpose of depleting the semiconductor body HK. In the operation of the DEPFET structure, a positive electric potential is therefore applied to the electrode RK in order to suction off the signal electrons from the semiconductor body HK and, in this way, to deplete the semiconductor body HK.

At the oppositely located surface of the semiconductor body HK there is a transistor structure with a highly p-doped source region S and a similarly highly p-doped drain region D, a channel K being located between the source region S and the drain region D, the conductivity of said channel can be controlled by means of a gate region G by applying a corresponding electric potential to the gate region G.

Moreover, in the semiconductor body HK below the channel K there is a buried n-doped inner gate region IG in which signal electrons gather which originate as a result of the radiation effect to be detected in the semiconductor body HK. The signal electrons gathered in the inner gate region IG control the conductivity of the channel K in a similar way as an electric control signal applied to the gate region G, so that the conductivity of the channel K is a measure for the charge carriers gathered in the inner gate region IG and, subsequently, for the incident radiation.

However, the inner gate region IG has only a limited pick-up capability for the signal electrons originating as a result of the radiation effect, and therefore must be emptied again occasionally in order to maintain the sensitivity of the entire DEPFET structure. For this purpose, a clear contact CL is envisaged consisting of a highly n-doped region at the surface of the semiconductor KH, the clear contact CL being located on the side of the gate region opposite the source region S near the drain region.

In this case, the inner gate region IG extends in the side direction up to a point below the clear contact CL. This provides the advantage to the effect that the suctioning of the signal electrons from the inner gate region IG is not hindered by the potential barrier which is produced by the high p-doping of the source region S extending into the inner gate region IG. The signal electrons gathered in the inner region IG can therefore be suctioned off with a relatively small and positive clear voltage which is applied to the clear contact CL.

The high p-doping of the source region as already mentioned above is effective all the way into the inner gate region IG with the result that the signal electrons gathered in the inner gate region IG are concentrated below the channel K and not below the source region. This is purposeful because the signal electrons below the source region S in the inner gate region IG do not contribute towards the control of the conductivity of the channel K.

A corresponding drain-side influencing of the inner gate region IG by a high doping of the drain region D is not required because the negative voltage applied to the drain region D concentrates the signal electrons, located in the inner gate region IG, in any event below the channel K.

For this reason it is also possible to form the drain region D separately by means of an inversion layer IS below a drain/clear region DCG, the drain/clear region DCG joining up directly to the p-doped drain region D and the n-doped clear contact CL.

The drain/clear region DCG, in dependence of its electrical activation, can selectively support the clearing of the inner gate region IG or serve as an additional drain region. With sufficient negative voltage at the drain/clear region DCG, the drain/clear region DCG takes over the function of the drain whereas, with sufficient positive voltages at the drain/clear region DCG and at the clear contact CL, it enables the clearing of the signal electrons stored in the inner gate region IG. As the deep n-doping in this case remains uninfluenced up to the clear contact CL, there is no potential barrier to overcome, so that the complete clearing can be effected with relatively low level voltages at the clear contact CL. Moreover, the drain/clear region DCG has a further function at the end of the clearing process. The transition to the read-out or storage mode, where the drain/clear region DCG again takes over the function of the drain, can take place before the re-set of the clear contact CL. With this sequence, electrons are advantageously prevented from flowing out of the clear contact CL and into the inner gate region IG.

Figure 2:
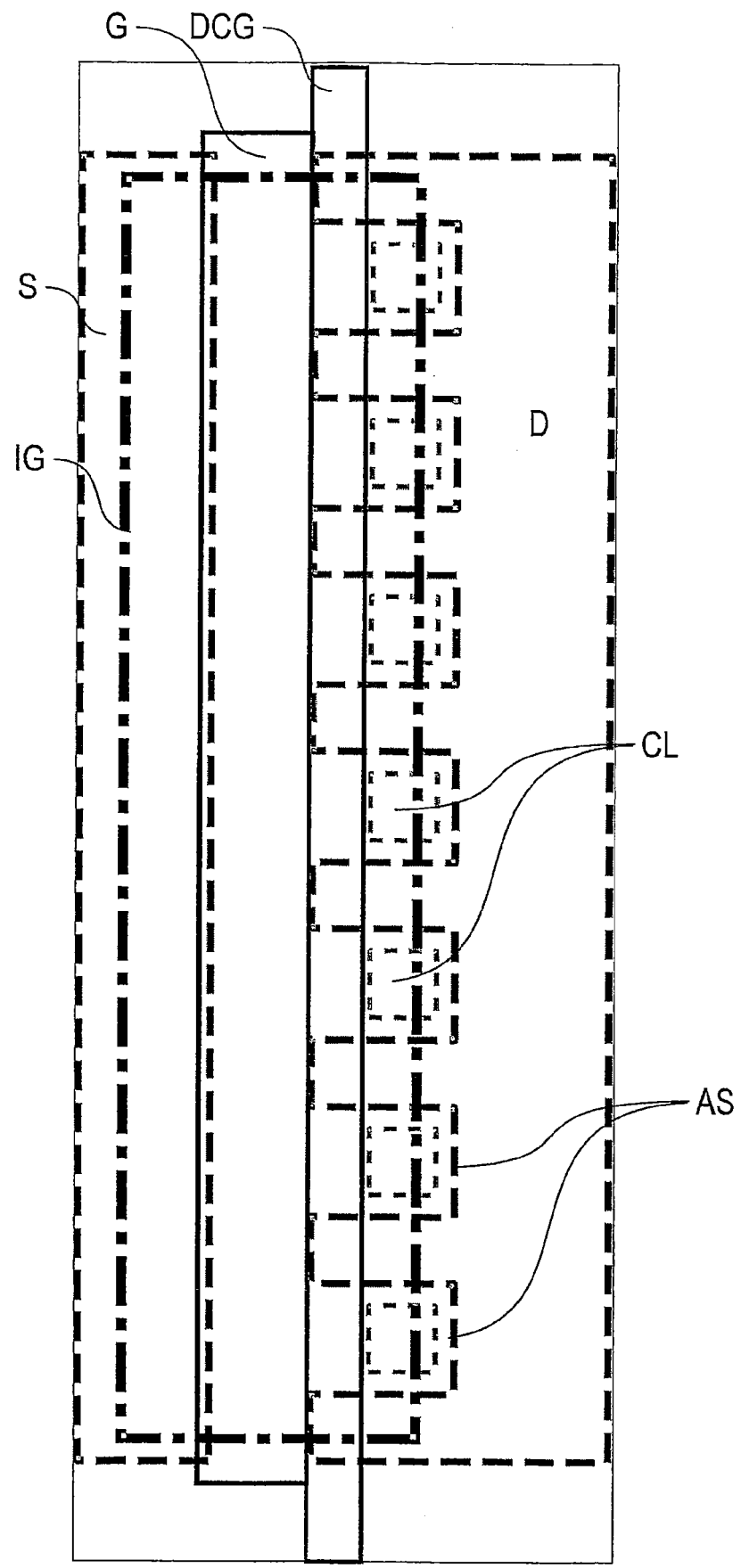

FIG. 2 shows a top view illustration of an alternative embodiment example of a linear DEPFET structure, this embodiment example corresponding extensively with the embodiment example described above and as shown in the FIGS. 1a-1c. For this reason and in order to avoid repetitions, reference is made to the description above, the same reference numbers being adopted for corresponding components.

A special feature of the embodiment example lies in the fact that the drain region D essentially extends over the entire expansion of the DEPFET structure, the drain region D having, in each case, gate-side recesses AS for several clear contacts CL. The spatially distributed arrangement of several clear contacts CL provides the advantage to the effect that the mean clearance between the signal electrons to be suctioned off in the inner gate region IG and the nearest clear contact CL is reduced, so that a shorter clearing duration is sufficient.

The individual clear contacts CL are connected with one another electrically in this case and are activated in common, the connection of the clear contacts CL not being shown for reasons of simplification.

Figure 3A:
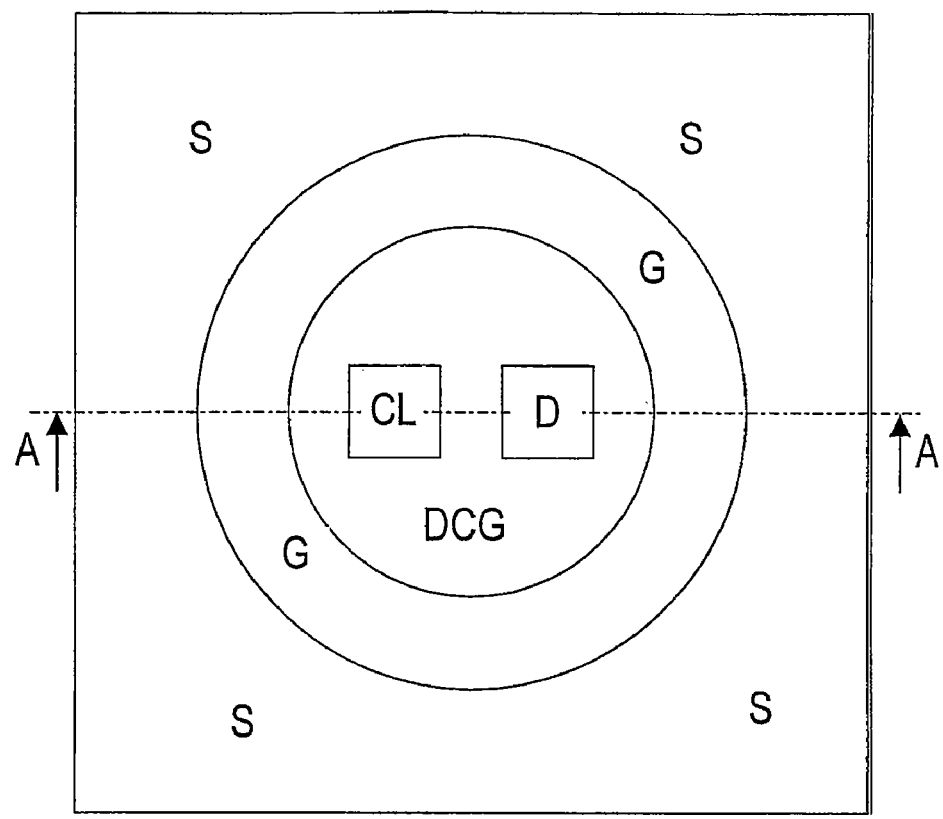
FIG. 3a: a top view illustration of a ring-shaped DEPFET structure according to the invention.
Figure 3B:
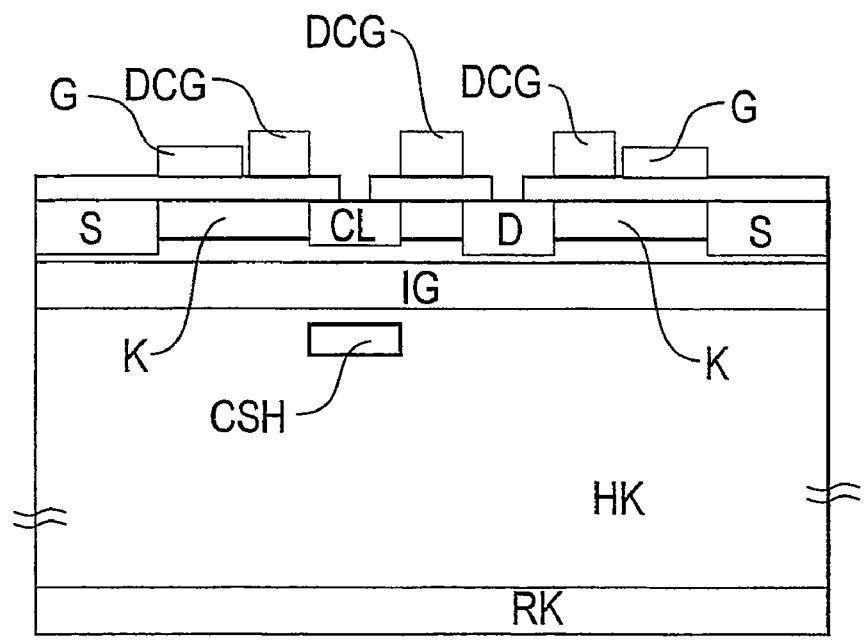
FIG. 3b: a cross-sectional view of the DEPFET structure from FIG. 3a along the cross-sectional line A-A in FIG. 3a, FIG. 4a: a further embodiment example of a ring-shaped DEPFET structure, according to the invention, in a top view illustration.

The FIGS. 3a and 3b show an embodiment example of a ring-shaped DEPFET structure according to the invention which, for example, can be deployed in the drift detector as a read-out element as described in L. STRÜDER: "Nuclear Instruments and Methods in Physics Research A", Vol. 454, 2000, DE 102 13 812 A1 or DE 34 27 476 A1.

This embodiment example also corresponds partially to the embodiment examples of a linear DEPFET structure as described above and as illustrated in the FIGS. 1a-1c so that, in order to avoid repetitions, reference is extensively made to the description to the FIGS. 1a-1c as presented above and, in the following, the same reference numbers are used for corresponding components.

A special feature of his embodiment example lies in the fact that the inner gate region IG extends over the entire surface. The high p-doping of the source region S in this case acts below the source region S up and into the inner gate region IG, through which the signal electrons gathered in the inner gate region IG are displaced in the direction of the drain region D. This is purposeful because only the signal electrons in the inner gate region IG below the channel K influence the conductivity of the channel K and go into the measurement in this way, whereas the signal electrons below the source region S have no influence on the conductivity of the channel K.

A further feature of this embodiment example lies in the fact that a p-doped shield region CSH is located in the semiconductor body HK below the inner gate region IG in the region of the clear contact CL. The purpose of this shield region CSH is to prevent signal electrons from flowing out of the semiconductor body HK directly to the clear contact CL.

The clear contact CL in this case is located within the ring-shaped gate region near the drain region D.

Moreover, the DEPFET structure in this embodiment example has a drain/clear region DCG from a MOS structure, the drain/clear region DCG immediately bordering at the clear contact CL and at the drain region D.

And with this embodiment example also, the drain-side arrangement of the clear contact CL enables a clearing of the signal electrons gathered in the inner gate region IG with a relatively low level clear voltage because the signal electrons during suctioning do not have to overcome the potential barrier produced by the source region S and/or the drain region D.

Figure 4A:
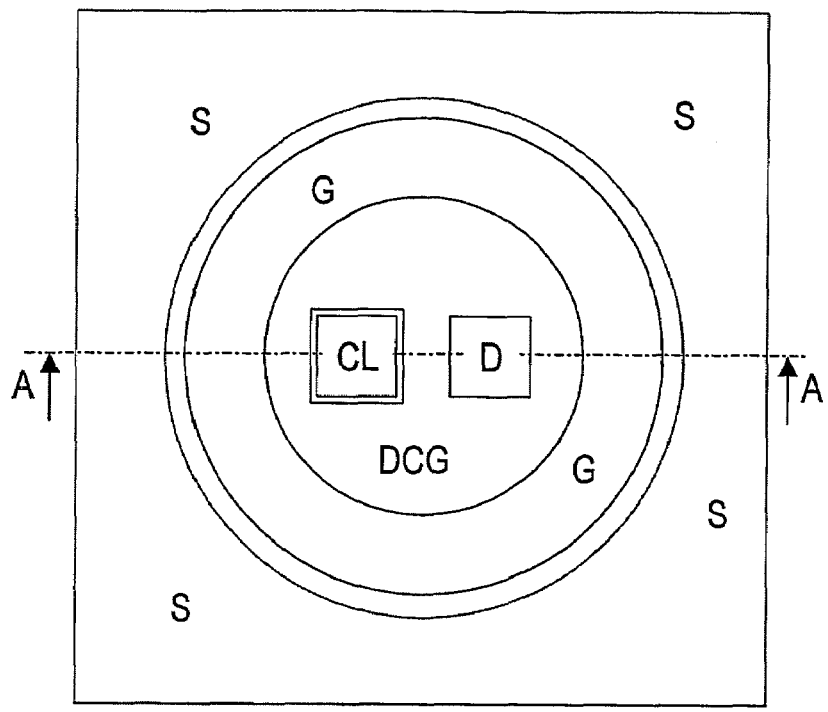
FIG. 4b: a cross-sectional view of the DEPFET structure from FIG. 4a along the cross-sectional line A-A in FIG. 4a, FIG. 5a: another embodiment example of a ring-shaped DEPFET structure, according to the invention, in a top view illustration.
Figure 4B:
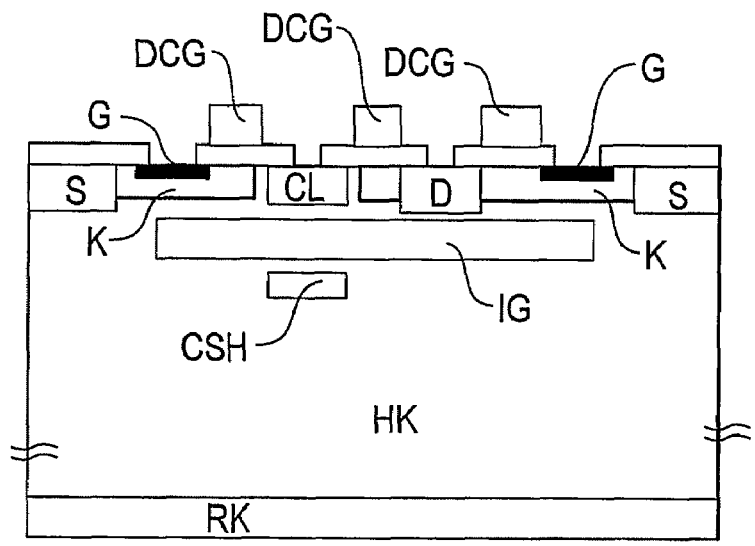

The FIGS. 4a and 4b show a further embodiment example of a ring-shaped DEPFET structure according to the invention that corresponds extensively with the embodiment example as described above and as described in the FIGS. 3a and 3b. In order to avoid repetitions, reference is extensively made to the description as presented above and, in the following, the same reference numbers are used for corresponding components.

A special feature of this embodiment example lies in the structural configuration of the gate region G that is formed as a flat n-doped region.

A further special feature of this embodiment example lies in the fact that the channel K is not led directly up to the clear contact CL, but that it maintains a pre-specified clearance from this. In this way, the electric field strength at the periphery of the clear contact CL is reduced. For the same reason, also the drain/clear region DCG here is drawn back slightly from the clear contact CL.

Figure 5A:
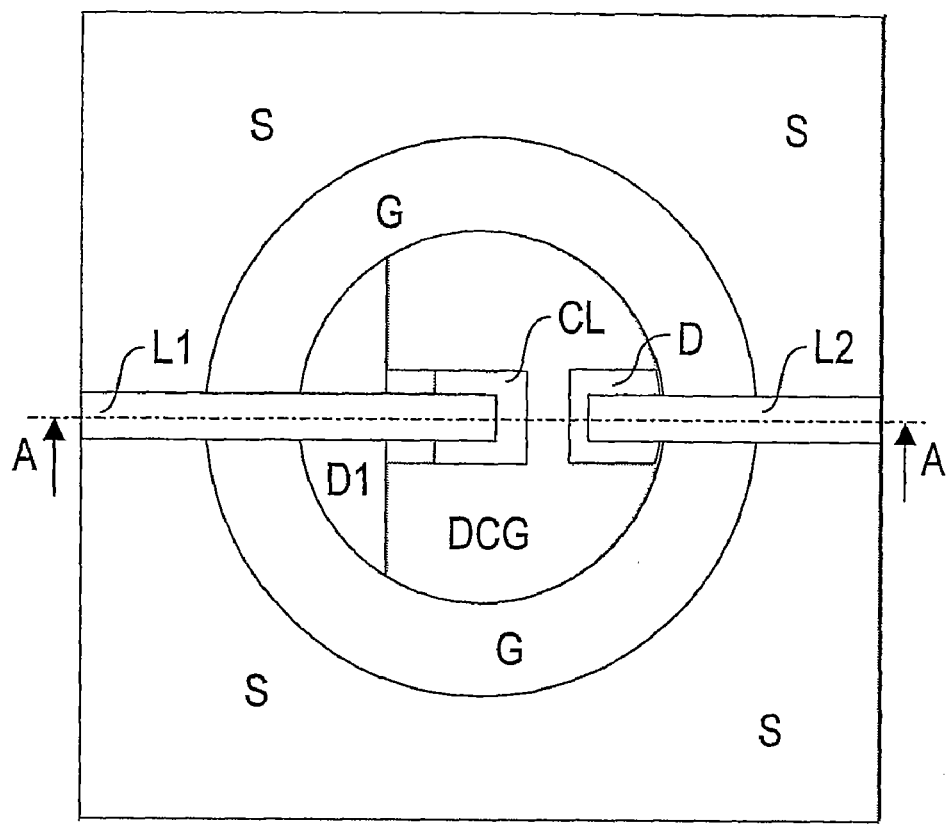
FIG. 5b: a cross-sectional view of the DEPFET structure from FIG. 5a along the cross-sectional line A-A in FIG. 5a, FIG. 6a: a drift detector with a DEPFET structure as read-out element in a top view illustration.
Figure 5B:
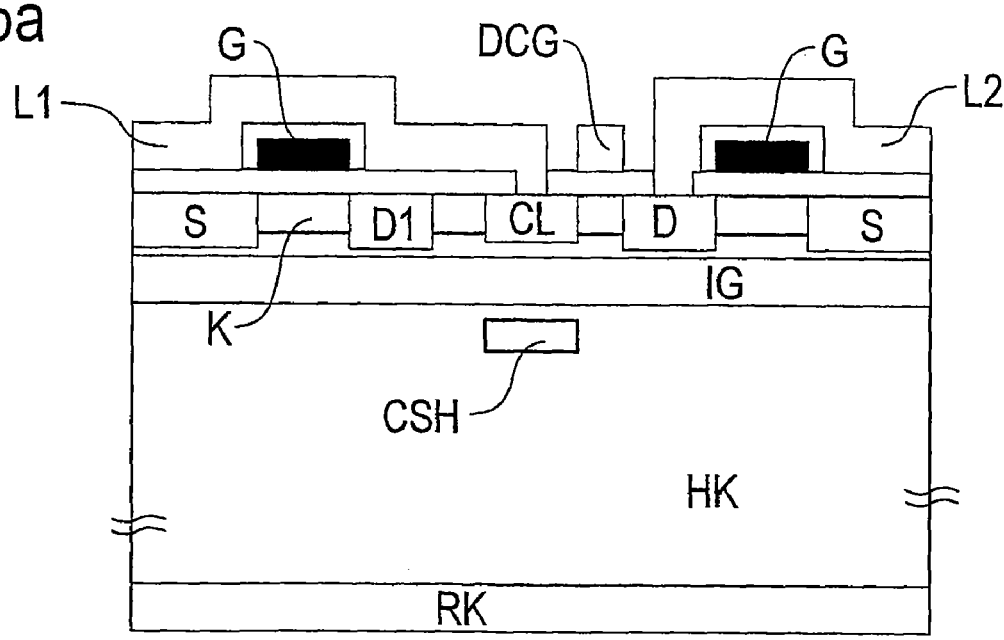

The FIGS. 5a and 5b show an embodiment example of a ring-shaped DEPFET structure according to the invention that also corresponds extensively with the embodiment example as described above and as described in the FIGS. 3a and 3b. In order to avoid repetitions, reference is extensively made to the description as presented above and, in the following, the same reference numbers are used for corresponding components.

A special feature of this embodiment example lies in the fact that a further drain region D1 is envisaged in addition to the drain region D, the two drain regions D, D1 bordering directly to the ring-shaped gate region G. The direct leading of the drain regions D, D1 up to the gate region G has the advantage that a crossover of these regions with printed conductors of random voltages is possible without having any essential influence on the properties of the DEPFET structure. In this way, the centrally located clear contact CL is contacted by a line transfer L1 while the drain region D is contacted by a line transfer L2.

Figure 6A:
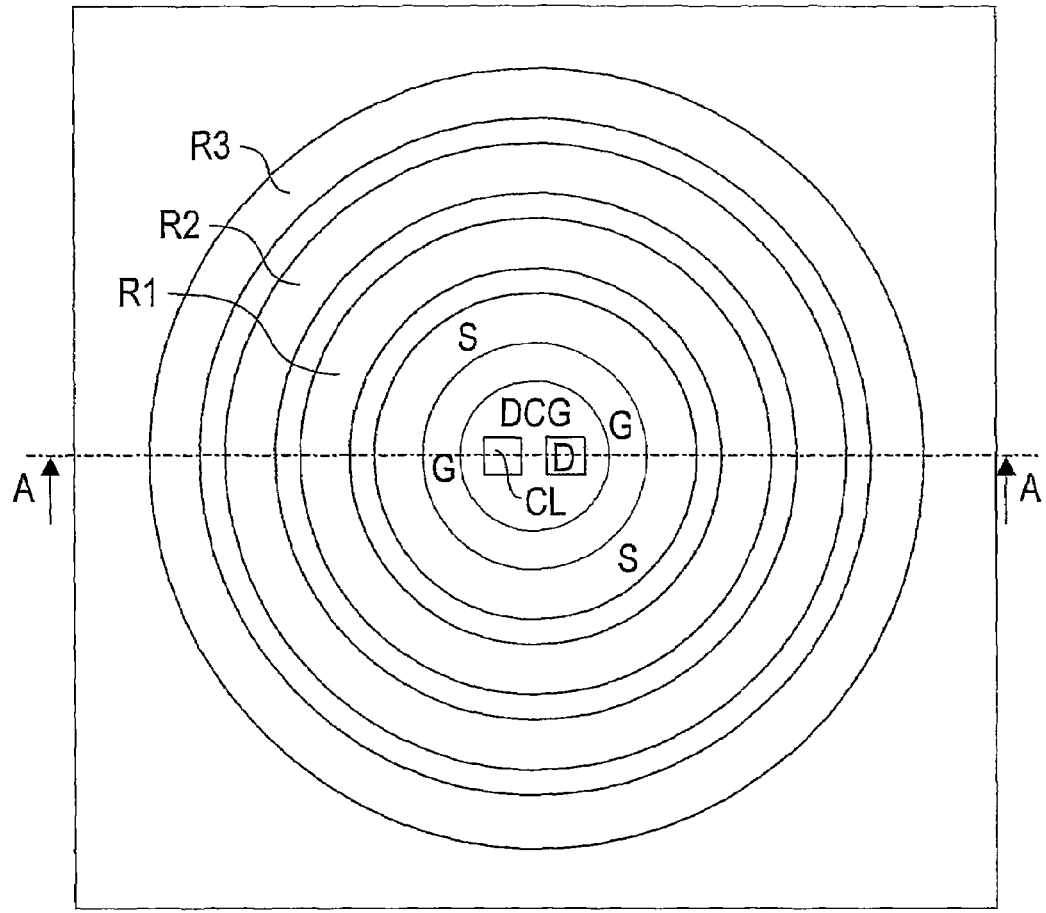
FIG. 6b: a cross-sectional view through the drift detector according to FIG. 6a along the cross-sectional line A-A in FIG. 6a, FIG. 7a: another embodiment example of a drift detector with a DEPFET structure, according to the invention, as read-out element in a top view illustration.
Figure 6B:
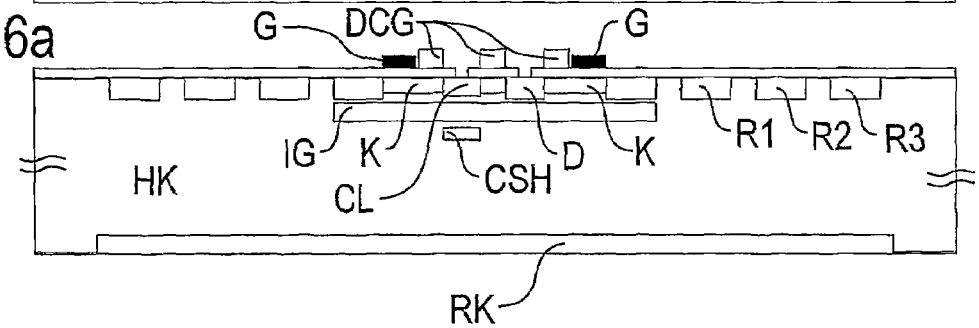

The FIGS. 6a and 6b show a complete drift detector with several ring electrodes R1, R2, R3 for the production of a drift field in the semiconductor body HK, a DEPFET structure being centrally located in the drift detector, as was described above with reference to the FIGS. 3a and 3b. With regard to the further structural configuration and the functioning mode of the drift detector, and for the purpose of avoiding repetitions, reference is made to the printed matter quoted above L. STRÜDER: "Nuclear Instruments and Methods in Physics Research A", Vol. 454, 2000, DE 34 27 476 A1 as well as in DE 102 13 812 A1, where the content of this printed matter is to be ascribed in the full scope to the description presented above.

The FIGS. 7a and 7b finally show an alternative embodiment example of such a drift detector that essentially corresponds to the drift detector as described above and as shown in the FIGS. 6a and 6b. In order to avoid repetitions, reference is made to the relevant description and, in the following, the same reference numbers are used for corresponding components.

A special feature of this embodiment example lies in the fact that four separate clear contacts CL spaced apart from one another are envisaged. This provides the advantage to the effect that the mean clearance between the signal electrons to be suctioned off from the inner gate region IG and the respective nearest-located clear contact CL is reduced. This enables shorter clearing times.

In addition to this, the arrangement of the source region S in the center of the ring-shaped structure enables a reduction of the inner gate region IG, through which the amplification and the noise reaction are improved.

Figure 8A:
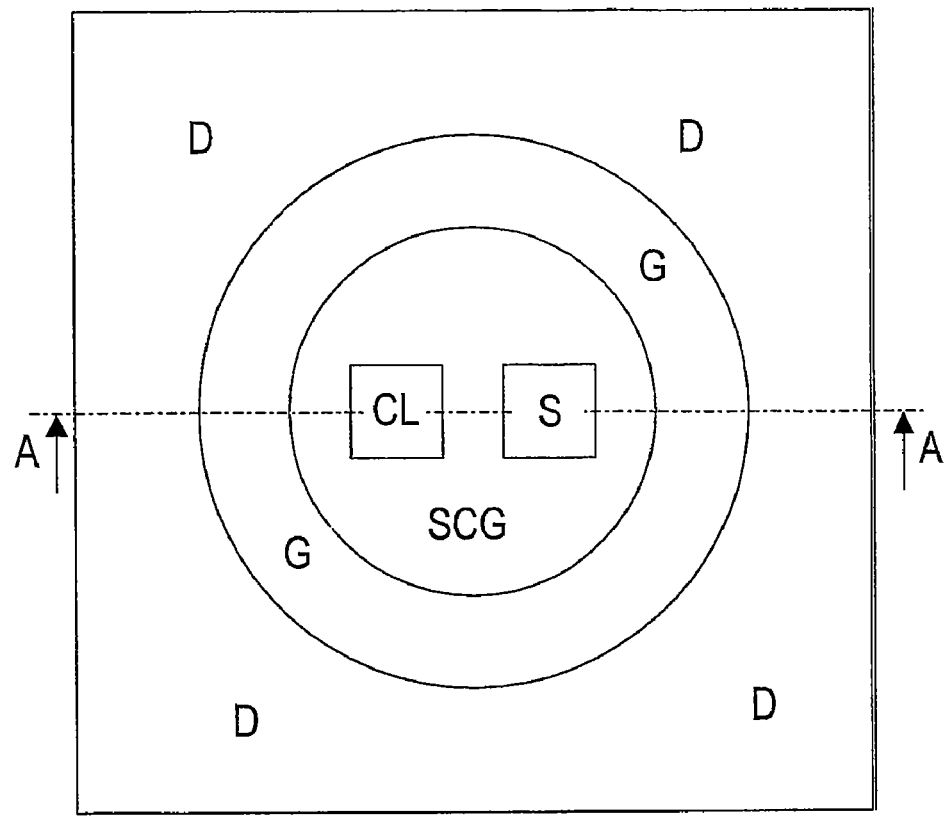
FIG. 8b: a cross-sectional view of the drift detector from FIG. 8a along the cross-sectional line A-A in FIG. 8a, FIG. 9a: a further embodiment example of a drift detector with a DEPFET structure, according to the invention, as read-out element in a top view illustration, a drain/clear region having a surface-near doping underneath.
Figure 8B:
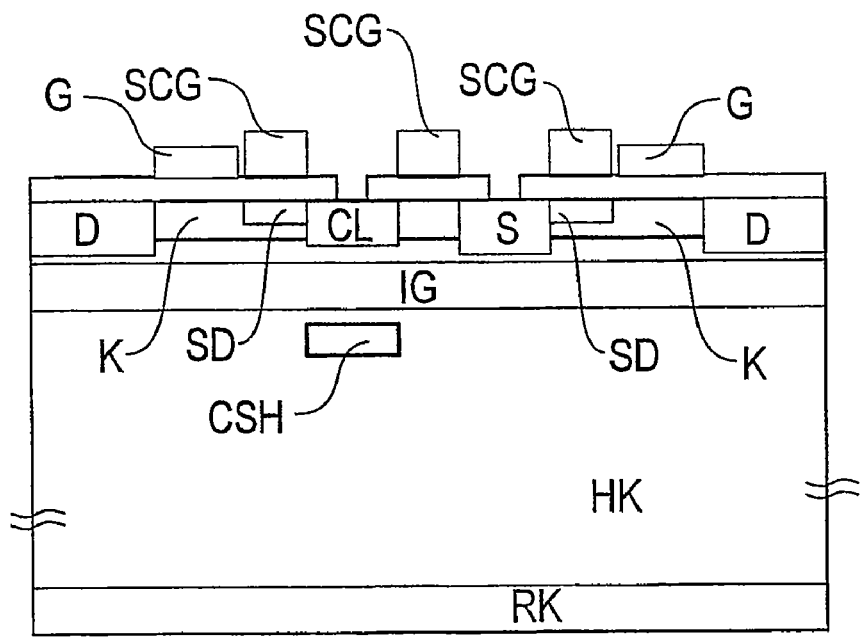

The FIGS. 8a and 8b show a further embodiment example of a ring-shaped DEPFET structure according to the invention that also corresponds extensively with the embodiment example as described above and as described in the FIGS. 3a and 3b. In order to avoid repetitions, reference is extensively made to the description as presented above and, in the following, the same reference numbers are used for corresponding components.

Compared with the embodiment example according to FIGS. 3a and 3b, however, this embodiment example essentially has three differences which are briefly described as follows.

One difference is that the drain region D is interchanged with the source region S. This interchanging can be advantageous for adapting to an external electronic system.

Another difference is that, instead of the drain/clear region DCG, a source/clear region SCG is envisaged that, however, essentially has the same function as the drain/clear region DCG with the embodiment example according to FIGS. 3a and 3b.

Furthermore, the source/clear region SCG with this embodiment example can be provided with an additional surface-near implantation SD, the implantation SD being p-doped. The additional surface-near doping SD brings about a shifting of the SCG-voltages as required for the operation of the structure. These can be subsequently brought into a more favorable region. This is particularly necessary for enrichment types because otherwise the positive charges occurring with silicon in the current-carrying condition require a high negative voltage at the SCG. It is, of course, also possible to take an analogous action for the gate region.

Figure 9A:
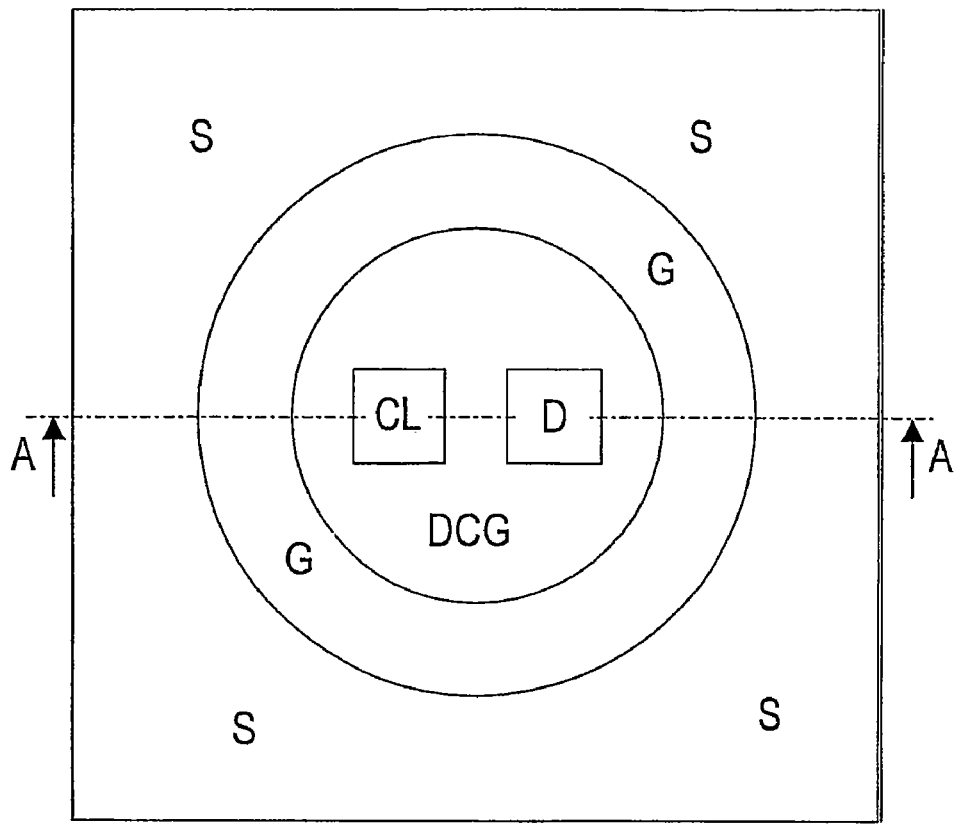
Figure 9B:
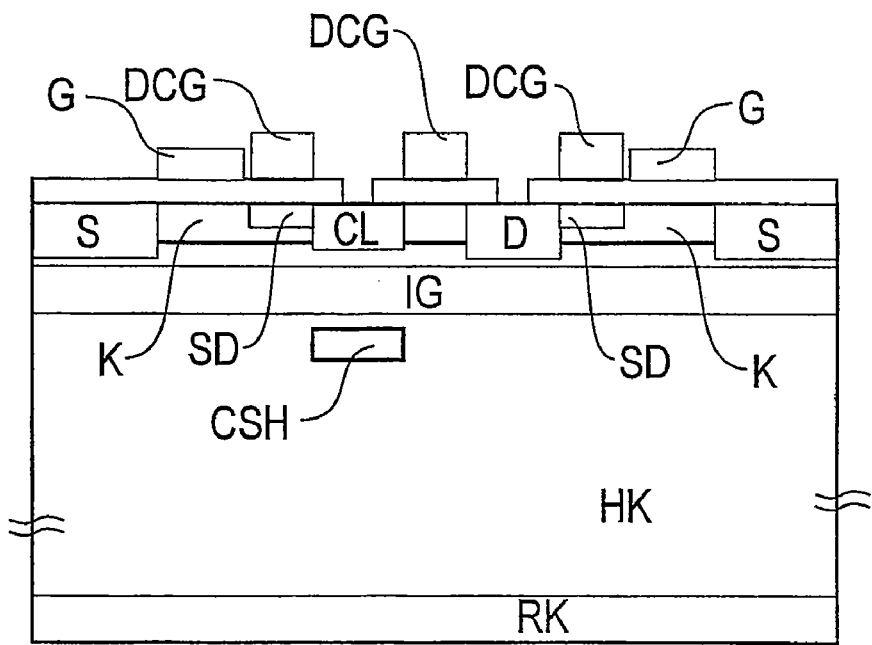

The FIGS. 9a and 9b show a further embodiment example of a ring-shaped DEPFET structure according to the invention that also corresponds extensively with the embodiment example as described above and as described in the FIGS. 8a and 8b. In order to avoid repetitions, reference is extensively made to the description as presented above and, in the following, the same reference numbers are used for corresponding components.

A difference opposite the embodiment example according to FIGS. 8a and 8b lies in the fact that the source region S and the drain region D are not interchanged. Therefore, the source region S and the drain region D are arranged here in the same way as in the embodiment example according to the FIGS. 3a and 3b.

Accordingly, no source/clear region SCG is envisaged also, but instead a drain/clear region DCG as in the embodiment example according to the FIGS. 3a and 3b.

The invention is not limited to the preferred embodiment examples as described above. In fact, a multiplicity of variants and developments is possible which also make use of the inventive line of thought and are therefore within the protective scope.

The invention claimed is:

1. A semiconductor structure, comprising:
   a weakly doped semiconductor substrate of a first or second doping type,
   a highly doped drain region of a second doping type, located at a first surface of the semiconductor substrate,
   a highly doped source region of the second doping type, located at the first surface of the semiconductor substrate,
   a channel extending between the source region and the drain region,
   a doped inner gate region of the first doping type, located in the semiconductor substrate, at least partially below the channel, and
   a clear contact for the removal of charge carriers from the inner gate region,
   wherein the inner gate region in the semiconductor substrate extends at least partially up to the clear contact.

2. The semiconductor structure according to claim 1, wherein the clear contact is located on a drain side relative to the source region.

3. The semiconductor structure according to claim 1, wherein the clear contact is located at least partially between the source region and the drain region.

4. The semiconductor structure according to claim 1, wherein a drain/clear region adapted for selective activation as an auxiliary clear contact or as a drain, borders to the clear contact and to the drain region or is led near to the drain region.

5. The semiconductor structure according to claim 1, wherein a source/clear region adapted for selective activation as an auxiliary clear contact or as a source, borders to the clear contact and to the source region or is led near to the source region.

6. The semiconductor structure according to claim 1, wherein, in the semiconductor substrate below the clear contact, a doped shield region of the second doping type is located which electrically shields off the clear contact.

7. The semiconductor structure according to claim 1, wherein the inner gate region in the semiconductor substrate extends from the source region up to the drain region.

8. The semiconductor structure according to claim 1, wherein the inner gate region in the semiconductor substrate is located at least partially below the drain region and the clear contact and is spaced apart from the source region.

9. The semiconductor structure according to claim 1, wherein the channel immediately borders on the clear contact.

10. The semiconductor structure according to claim 1, wherein the channel extends to the clear contact up to a pre-specified distance.

11. The semiconductor structure according to claim 1, wherein the drain region is divided up into several partial regions which are spaced apart from one another.

12. The semiconductor structure according to claim 11, wherein a first partial region of the drain region is directly contacted, while a second partial region of the drain region is contacted by way of an inversion layer below the drain/clear region.

13. The semiconductor structure according to claim 1, further comprising a first line transfer for contacting the drain region.

14. The semiconductor structure according to claim 13, further comprising a second line transfer for contacting the clear contact.

15. The semiconductor structure according to claim 1, wherein a closed and/or ring-shaped gate region controls the channel.

16. The semiconductor structure according to claim 15, wherein the clear contact is located within the gate region, while the source region is located outside of the gate region.

17. The semiconductor structure according to claim 15, wherein the drain region is located within the gate region, while the source region is located outside of the gate region.

18. The semiconductor structure according to claim 15, wherein the drain/clear region is located within the gate region, while the source region is located outside of the gate region.

19. The semiconductor structure according to claim 15, wherein the clear contact is located outside of the gate region, while the source region is located within the gate region.

20. The semiconductor structure according to claim 15, wherein the drain region is located outside of the gate region, while the source region is located within the gate region.

21. The semiconductor structure according to claim 15, wherein the drain/clear region are located outside of the gate region, while the source region is located within the gate region.

22. The semiconductor structure according to claim 15, wherein the drain/clear region adjoins an entire periphery of the gate region.

23. The semiconductor structure according to claim 15, wherein the gate region borders only with a part of a periphery on the drain/clear region and with the rest of the periphery on a doped region of the second doping type that is joined to the drain region and/or borders on the drain region.

24. The semiconductor structure according to claim 1, wherein the clear contact is divided up into several parts.

25. The semiconductor structure according to claim 1, wherein a region of the second doping type is located at a second surface of the semiconductor substrate for the purpose of depleting the semiconductor substrate.

26. The semiconductor structure according to claim 1, wherein the first doping type is n-doped, whereas the second doping type is p-doped.

27. The semiconductor structure according to claim 1, wherein the first doping type is p-doped, whereas the second doping type is n-doped.

28. The semiconductor structure according to claim 1, wherein the semiconductor substrate is silicon.

29. The semiconductor structure according to claim 1, wherein the drain/clear region is a MOS region.

30. The semiconductor structure according to claim 1, provided in a form of a depletion type semiconductor structure with additional channel implantation.

31. The semiconductor structure according to claim 1, provided in a form of an enrichment type semiconductor structure without additional channel implantation.

32. The semiconductor structure according to claim 4, wherein the drain/clear region has underneath a surface-near implantation of the second doping type.

33. The semiconductor structure according to claim 4, wherein the source/clear region has underneath a surface-near implantation of the second doping type.

34. A detector with a semiconductor structure according to claim 1.

* * * * *